(12) United States Patent
Chun

(10) Patent No.: US 10,515,704 B2
(45) Date of Patent: Dec. 24, 2019

(54) SEMICONDUCTOR MEMORY DEVICE AND OPERATING METHOD THEREOF

(71) Applicant: SK hynix Inc., Gyeonggi-do (KR)

(72) Inventor: Dong Yeob Chun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/993,143

(22) Filed: May 30, 2018

(65) Prior Publication Data

US 2019/0122736 A1  Apr. 25, 2019

(30) Foreign Application Priority Data

Oct. 20, 2017  (KR) .......................... 10-2017-0136671

(51) Int. Cl.
| | | |
|---|---|---|
| *G11C 16/04* | (2006.01) | |
| *G11C 16/26* | (2006.01) | |
| *G06F 11/10* | (2006.01) | |
| *G11C 29/52* | (2006.01) | |
| *G11C 11/56* | (2006.01) | |
| *G11C 16/14* | (2006.01) | |
| *G11C 16/10* | (2006.01) | |

(52) U.S. Cl.
CPC .......... *G11C 16/26* (2013.01); *G06F 11/1048* (2013.01); *G06F 11/1068* (2013.01); *G11C 29/52* (2013.01); *G11C 11/5642* (2013.01); *G11C 11/5671* (2013.01); *G11C 16/10* (2013.01); *G11C 16/14* (2013.01)

(58) Field of Classification Search
CPC ..... G11C 16/26; G11C 29/52; G11C 11/5642; G06F 11/1048; G06F 11/1068
USPC ...................................................... 365/185.18
See application file for complete search history.

(56) References Cited

U.S. PATENT DOCUMENTS

| | | | | |
|---|---|---|---|---|
| 9,336,838 | B1 * | 5/2016 | Yun | ........................ G11C 7/1048 |
| 2004/0249985 | A1 * | 12/2004 | Mori | ...................... G06F 3/0613 |
| | | | | 709/250 |
| 2018/0108389 | A1 * | 4/2018 | Seong | ................... G11C 7/1051 |

FOREIGN PATENT DOCUMENTS

| | | |
|---|---|---|
| KR | 100843546 | 7/2008 |
| KR | 101382563 | 4/2014 |
| KR | 1020170062351 | 6/2017 |

* cited by examiner

*Primary Examiner* — Vu A Le
(74) *Attorney, Agent, or Firm* — IP & T Group LLP

(57) ABSTRACT

A semiconductor memory device includes a memory cell array, a peripheral circuit, a ready busy signal generator, and a control logic. The memory cell array includes a plurality of memory cells. The peripheral circuit is configured to perform one of a read operation, a write operation, and an erase operation on the memory cell array. The ready busy signal generator is configured to selectively output one of an internal ready busy signal and an external ready busy signal according to an operation of the semiconductor memory device. The control logic is configured to control operations of the peripheral circuit and the ready busy signal generator.

17 Claims, 13 Drawing Sheets

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2017-0136671, filed on Oct. 20, 2017, which is incorporated herein by reference in its entirety.

BACKGROUND

1. Field of Invention

Various exemplary embodiments of the present disclosure generally relate to an electronic device. Particularly, the embodiments relate to a semiconductor memory device and an operating method thereof.

2. Description of the Related Art

A semiconductor memory device is a storage device implemented using a semiconductor such as silicon (Si), germanium (Ge), gallium arsenide (GaAs), or indium phosphide (InP). The semiconductor memory device is generally classified into a volatile memory device and a nonvolatile memory device.

The volatile memory loses stored data when a power supply is cut off. Examples of the volatile memory include a static random access memory (SRAM), a dynamic RAM (DRAM), a synchronous DRAM (SDRAM), and the like. The nonvolatile memory retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a semiconductor memory device capable of selectively outputting an internal ready busy signal and an external ready busy signal.

Embodiments also provide an operating method of a semiconductor memory device capable of selectively outputting an internal ready busy signal and an external ready busy signal.

According to an aspect of the present disclosure, there is provided a semiconductor memory device including: a memory cell array including a plurality of memory cells; a peripheral circuit configured to perform one of a read operation, a write operation, and an erase operation on the memory cell array; a ready busy signal generator configured to selectively output one of an internal ready busy signal and an external ready busy signal according to an operation of the semiconductor memory device; and control logic configured to control operations of the peripheral circuit and the ready busy signal generator.

The ready busy signal generator may include a signal selector configured to receive the external ready busy signal and the internal ready busy signal, and receive a status read control signal from the control logic. The signal selector may select and output one of the external ready busy signal and the internal ready busy signal, based on the status read control signal.

The signal selector may select and output the internal ready busy signal when the status read control signal is enabled, and select and output the external ready busy signal when the status read control signal is disabled.

The semiconductor memory device may receive a status read signal from a controller. The control logic may output the enabled status read control signal to the ready busy signal generator when the status read signal includes a first command, and output the disabled status read control signal to the ready busy signal generator when the status read signal does not include the first command.

The signal selector may be configured as a multiplexer.

The ready busy signal generator may further include an external ready busy signal generator configured to generate an external ready busy signal and transfer the external ready busy signal to the signal selector.

The ready busy signal generator may further include an internal ready busy signal generator configured to generate an internal ready busy signal and transfer the internal ready busy signal to the signal selector.

The ready busy signal may be output through a ready busy line provided separately from a data input/output line.

According to an aspect of the present disclosure, there is provided a method for operating a semiconductor memory device, the method including: receiving a status read signal from a controller; determining whether the status read signal includes a first command; and outputting a ready busy signal, based on the result of the determining operation.

When the result of the determining operation is that the status read signal includes the first command, an internal ready busy signal may be output in the outputting operation.

When the result of the determining operation is that the status read signal does not include the first command, an external ready busy signal may be output in the outputting operation.

According to an aspect of the present disclosure, there is provided a semiconductor memory device including: a memory cell array including a plurality of memory cells; a peripheral circuit configured to perform one of a read operation, a write operation, and an erase operation on the memory cell array; and a ready busy signal generator configured to output a ready busy signal, wherein the ready busy signal generator is configured to selectively output one of an internal ready busy signal and an external ready busy signal according to an operation of the semiconductor memory device.

The internal ready busy signal may indicate a busy status when the peripheral circuit is performing one of the read operation, the write operation, and the erase operation on the memory cell array.

The external ready busy signal may indicate whether the semiconductor memory device is ready to receive a command from a controller.

The ready busy signal generator may include a signal selector configured to receive the external ready busy signal and the internal ready busy signal, and select and output one of the external ready busy signal and the internal ready busy signal, based on a status read control signal.

The signal selection unit may be configured as a multiplexer.

According to an aspect of the present disclosure, there is provided a method for operating a semiconductor memory device, the method including: enabling a status read control signal in response to a request of an internal ready busy signal; providing the internal ready busy signal when the status read control signal is enabled; and providing an external ready busy signal when the status read control signal is disabled. The internal ready busy signal represents whether the memory device is performing an operation. The external ready busy signal represents whether the memory device is ready to receive a command. The memory device performs an operation in response to the command.

BRIEF DESCRIPTION OF THE DRAWINGS

Various embodiments will now be described more fully with reference to the accompanying drawings; however, aspects and features of the disclosure may be configured or arranged differently than in the disclosed embodiments. Thus, the present disclosure is not to be construed as limited to the embodiments set forth herein. Rather, these embodiments are provided so that this disclosure will be thorough and complete, and will fully convey the scope of the present disclosure to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals may refer to like elements throughout.

DETAILED DESCRIPTION

Figure 1:
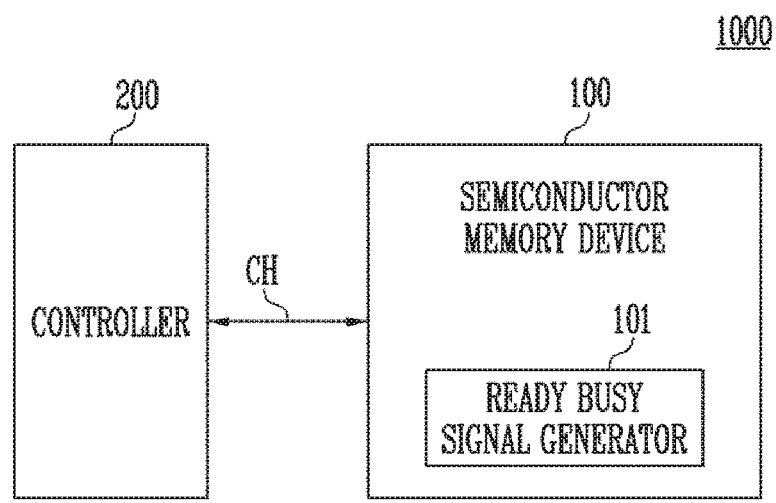
FIG. 1 is a block diagram illustrating a memory system including a semiconductor memory device and a controller in accordance with an embodiment of the present disclosure.

In the following detailed description, various embodiments of the present disclosure are shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may include not only the identified component(s) but one or more additional components, unless stated or the context requires otherwise.

Embodiments of the present disclosure will be described in detail with reference to the accompanying drawings. The same reference numerals are used to designate the same elements as those shown in other drawings. In the following description, only portions necessary for understanding operations according to the embodiments may be described; description of other portions may be omitted so as to not obscure important concepts of the embodiments. It is noted that reference to "an embodiment" does not necessarily mean only one embodiment, and different references to "an embodiment" are not necessarily to the same embodiment(s).

Hereinafter, the various embodiments of the present invention will be described in detail with reference to the attached drawings.

FIG. 1 is a block diagram illustrating a memory system 1000 including a semiconductor memory device 100 and a controller 200 in accordance with an embodiment of the present disclosure.

Figure 2:
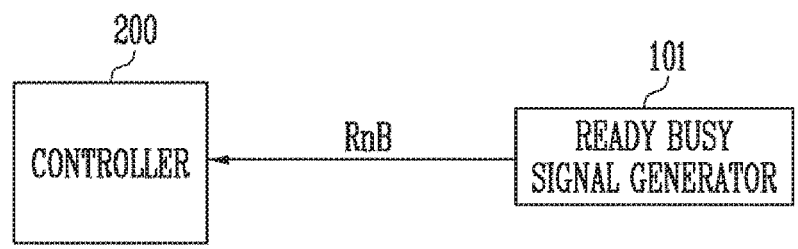
FIG. 2 is a diagram illustrating an embodiment of a ready busy signal communicated between a ready busy signal generator and the controller.

FIG. 2 is a diagram illustrating an embodiment of a ready busy signal communicated between a ready busy signal generator 101 and the controller 200.

Figure 3:
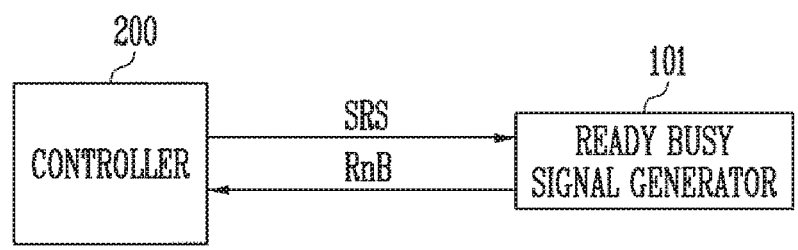
FIG. 3 is a diagram illustrating another embodiment of the ready busy signal communicated between the ready busy signal generator and the controller.

FIG. 3 is a diagram illustrating another embodiment of the ready busy signal communicated between the ready busy signal generator 101 and the controller 200.

Referring to FIG. 1, the memory system 1000 may include the semiconductor memory device 100 and the controller 200.

The semiconductor memory device 100 operates in response to the control of the controller 200. The semiconductor memory device 100 may include a memory cell array having a plurality of memory blocks. In an embodiment, the semiconductor memory device 100 may be a flash memory device.

The semiconductor memory device 100 may receive a command and an address from the controller 200 through a channel CH and access a region selected by the address in the memory cell array. That is, the semiconductor memory device 100 performs an internal operation on the region selected by the address in response to the command.

For example, the semiconductor memory device 100 may perform a program operation, a read operation, and an erase operation. In the program operation, the semiconductor memory device 100 may program data in the region selected by the address. In the read operation, the semiconductor memory device 100 may read data from the region selected by the address. In the erase operation, the semiconductor memory device 100 may erase data stored in the region selected by the address.

The semiconductor memory device 100 may include a ready busy signal generator 101. The ready busy signal generator 101 outputs a status signal indicating whether the semiconductor memory device 100 corresponds to, or occupies, a ready status or a busy status. In other words, the status signal indicates whether the semiconductor memory device 100 is in a ready state or a busy state.

That the semiconductor memory device 100 corresponds to the ready status may mean that the semiconductor memory device 100 has completed an internal operation and now stands by. For example, that the semiconductor memory device 100 corresponds to the ready status may mean that the semiconductor memory device 100 has completed a program, read, or erase operation in response to a command.

That the semiconductor memory device 100 corresponds to the busy status may mean that the semiconductor memory device 100 is still performing an internal operation. For example, that the semiconductor memory device 100 corresponds to the busy status may mean that the semiconductor memory device 100 is still performing a program, read, or erase operation in response to a command.

In an embodiment, as shown in FIG. 2, the ready busy signal generator 101 may output a ready busy signal RnB to the controller 200. The ready busy signal generator 101 may be coupled to the controller 200 through a ready busy line (not shown) different from the channel CH, and output the ready busy signal RnB through the ready busy line. As an example, that the ready busy signal RnB is disabled as logical value 'high' may mean that the semiconductor memory device 100 corresponds to the ready status, and that the ready busy signal RnB is enabled as logical value 'low' may mean that the semiconductor memory device 100 corresponds to the busy status. As another example, that an output node of the ready busy signal RnB has a high impedance may mean that the semiconductor memory device 100 corresponds to the ready status, and that the output node of the ready busy signal RnB has a low impedance may mean that the semiconductor memory device 100 corresponds to the busy status.

In an embodiment, as shown in FIG. 3, the ready busy signal generator 101 may output the ready busy signal RnB as a status signal, based on a status read signal SRS from the controller 200. The controller 200 may transmit through the channel CH (see FIG. 1) a status read signal SRS to the semiconductor memory device 100, and the ready busy signal generator 101 may transmit the ready busy signal RnB as a response to the status read signal SRB to the controller 200 through the channel CH. In the embodiment shown in FIG. 3, the ready busy signal RnB may be included in a status read response signal transmitted to the controller 200 in response to the status read signal SRS. That the ready busy signal RnB has a first status value may mean that the semiconductor memory device 100 corresponds to the ready status, and that the ready busy signal RnB has a second status value may mean that the semiconductor memory device 100 corresponds to the busy status.

When the status signal indicates the ready status, the controller 200 may transmit a next command to the semiconductor memory device 100.

Referring back to FIG. 1, the controller 200 controls the semiconductor memory device 100 through the channel CH. The controller 200 commands the semiconductor memory device 100 in response to a request from a host (not shown). When the status signal indicates the ready status, the controller 200 may command the semiconductor memory device 100 to perform a specific operation. When the status signal indicates the busy status, the controller 200 may stand by until the status signal indicates the ready status and then command the semiconductor memory device 100.

In an embodiment, the controller 200 may control the semiconductor memory device 100 to perform a program operation, a read operation, an erase operation, or the like. In the program operation, the controller 200 may provide a program command, an address, and data to the semiconductor memory device 100 through the channel CH. In the read operation, the controller 200 may provide a read command and an address to the semiconductor memory device 100 through the channel CH. In the erase operation, the controller 200 may provide an erase command and an address to the semiconductor memory device 100 through the channel CH.

In an embodiment, the controller 200 may include components such as a random access memory (RAM), a processor, a host interface, and a memory interface. The RAM is used as at least one of a working memory of the processor, a cache memory between the semiconductor memory device 100 and the host, and a buffer memory between the semiconductor memory device 100 and the host. The processor controls overall operations of the controller.

The host interface may include a protocol for exchanging data between the host and the controller 200. As an example, the controller 200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ready busy signal RnB shown in FIGS. 1 to 3 is an external ready busy signal that allows the controller 200 to determine an operation status of the semiconductor memory device 100. There is also an internal ready busy signal for an actual internal operation of the semiconductor memory device 100.

However, the internal ready busy signal is not generally transferred to the controller 200. Since the ready busy signal RnB is transferred through a separate ready busy line (not shown), distinguished from the channel CH as described with reference to FIG. 2, the controller 200 can determine an operation status of the semiconductor memory device 100 through the ready busy signal RnB even when a status read operation is not performed. However, in this case, the ready busy signal RnB transferred to the controller 200 is the external ready busy signal. Therefore, when the external ready busy signal and the internal ready busy signal are different from each other (i.e., when the external ready busy signal and the internal ready busy signal represent different statuses of the semiconductor memory device 100), the controller 200 cannot determine an accurate internal operation status of the semiconductor memory device 100. Examples of the internal ready busy signal and the external ready busy signal will be described later with reference to FIG. 11.

Figure 4:
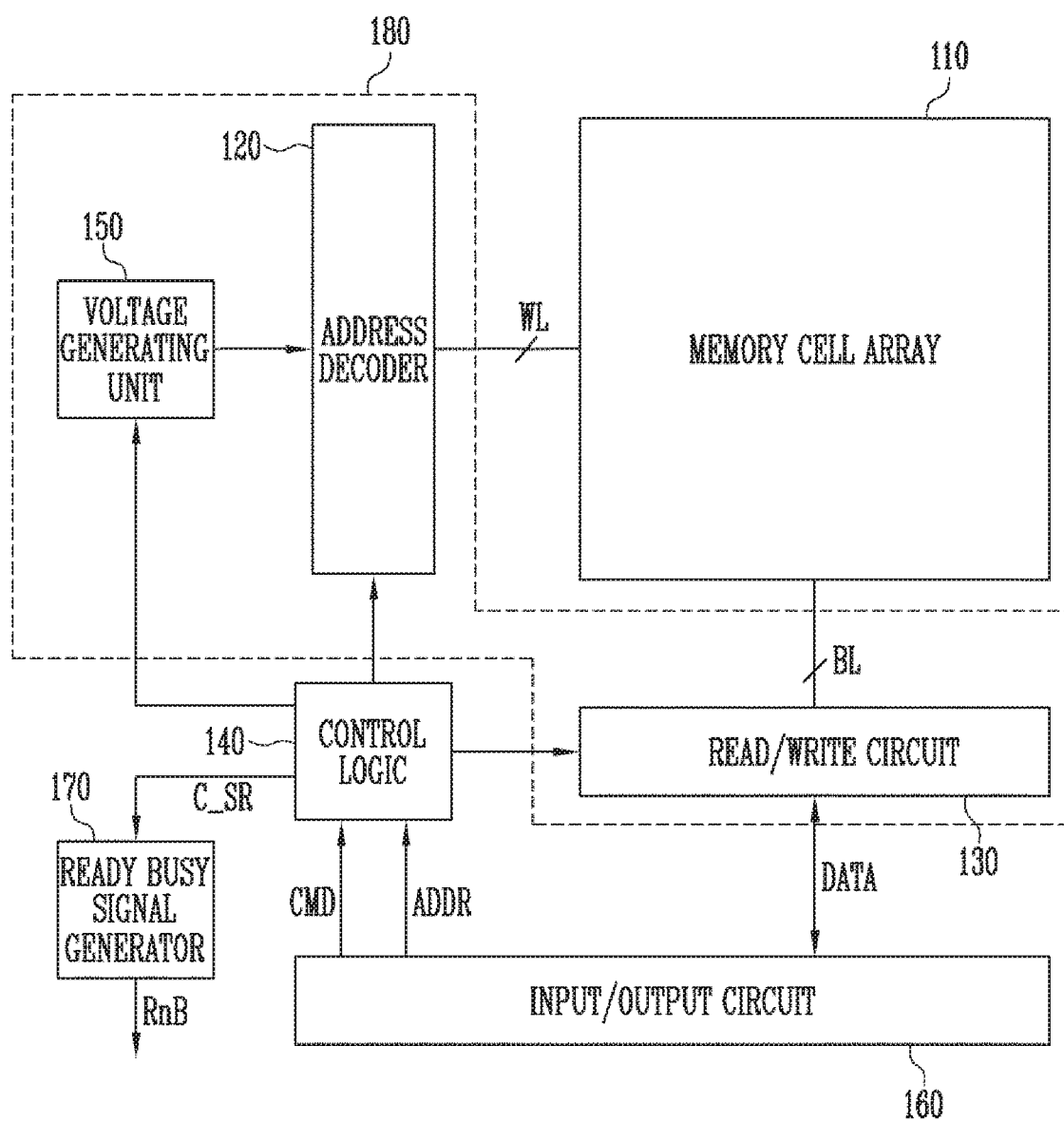
FIG. 4 is a block diagram illustrating a structure of the semiconductor memory device of FIG. 1 in accordance with an embodiment of the present disclosure.
Figure 5:
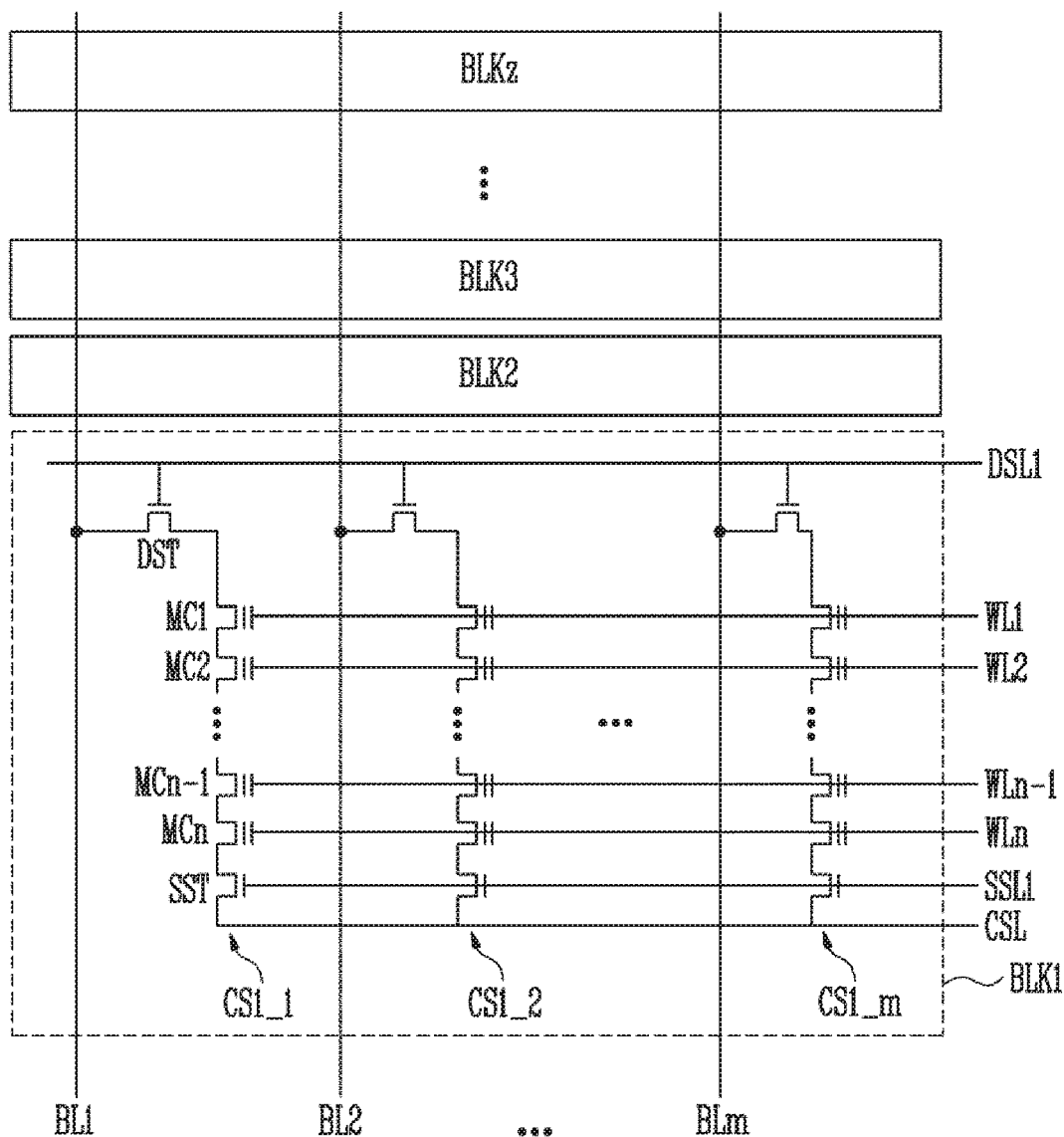
FIG. 5 is a diagram illustrating an embodiment of a memory cell array of FIG. 4.

FIG. 4 is a block diagram illustrating a structure of the semiconductor memory device 100 of FIG. 1 in accordance with an embodiment of the present disclosure. FIG. 5 is a diagram illustrating an embodiment of a memory cell array of FIG. 4. In FIG. 5, the memory cell array is identified by the reference numeral 110_1.

Referring to FIG. 4, the semiconductor memory device 100 may include a memory cell array 110, a peripheral circuit 180, control logic 140, and a ready busy signal generator 170. Meanwhile, the peripheral circuit 180 may include an address decoder 120, a read/write circuit 130, and a voltage generating unit 150.

The memory cell array 110 may be coupled to the address decoder 120 through word lines WL, a source select line (not shown), and a drain select line (not shown), and be coupled to the read/write circuit 130 through bit lines BL.

The memory cell array 110 may include a plurality of memory blocks BLK1 to BLKz. BLK1 to BLKz are coupled to the address decoder 120 through the word lines WL, the source select line (not shown), and the drain select line (not shown). The plurality of memory blocks BLK1 to BLKz are coupled to the read/write circuit 130 through bit lines BL1 to BLm. Each of the plurality of memory blocks BLK1 to BLKz may include a plurality of memory cells. In an embodiment, the plurality of memory cells are nonvolatile memory cells. Among the plurality of memory cells, those coupled to the same word line is defined as one page. That is, the memory cell array 110 is configured with a plurality of pages.

Each of the memory cells of the semiconductor memory device 100 may be configured as a single level cell (SLC) for storing one data bit, a multi-level cell (MLC) for storing two data bits, a triple level cell (TLC) for storing three data bits, or a quad level cell (QLC) for storing four data bits. In various embodiments, the memory cell array 110 may include a plurality of memory cells, each of which stores 5 or more bits of data.

The memory cell array 110_1 of FIG. 5 illustrates an embodiment of the memory cell array 110 of FIG. 4.

Referring to FIG. 5, first to zth memory blocks BLK1 to BLKz included in the memory cell array 110_1 are commonly coupled to first to mth bit lines BL1 to BLm. In FIG. 5, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_*m*. First to mth cell strings CS1_1 to CS1_*m* are coupled to the first to mth bit lines BL1 to BLm, respectively.

Each of the first to mth cell strings CS1_1 to CS1_*m* may include a drain select transistor DST, a plurality of memory cells MC1 to MCn coupled in series, and a source select transistor SST. The drain select transistor DST is coupled to a drain select line DSL1. First to nth memory cells MC1 to MCn are coupled to first to nth word lines WL1 to WLn, respectively. The source select transistor SST is coupled to a source select line SSL1. A drain of the drain select transistor DST is coupled to a corresponding bit line. The drain select transistors of the first to mth cell strings CS1_1 to CS1_*m* are coupled to the first to mth bit lines BL1 to BLm, respectively. A source of the source select transistor SST is coupled to a common source line CSL. In an embodiment, the common source line CSL may be commonly coupled to the first to zth memory blocks BLK1 to BLKz.

The drain select line DSL1, the first to nth word lines WL1 to WLn, and the source select line SSL1 are controlled by the address decoder 120. The common source line CSL is controlled by the control logic 140. The first to mth bit lines BL1 to BLm are controlled by the read/write circuit 130.

Referring back to FIG. 4, the peripheral circuit 180 drives the memory cell array 110. For example, the peripheral circuit 180 may drive the memory cell array 110 to perform a program operation, a read operation, and an erase operation.

The address decoder 120 is coupled to the memory cell array 110 through the word lines WL, the drain select line, and the source select line. The address decoder 120 is configured to operate in response to the control of the control logic 140. The address decoder 120 receives an address ADDR from the control logic 140 through an input/output buffer (not shown) in the semiconductor memory device 100.

The address decoder 120 is configured to decode a block address in the received address ADDR. The address decoder 120 selects at least one memory block among the memory blocks BLK1 to BLKz according to the decoded block address. The address decoder 120 is configured to decode a row address in the received address ADDR. The address decoder 120 may select at least one word line WL of the selected memory block by applying voltages provided from the voltage generating unit 150 to the word line WL according to the decoded row address.

In a program operation, the address decoder 120 may apply a program voltage to the selected word line, and apply a pass voltage having a level lower than that of the program voltage to unselected word lines. In a program verify operation, the address decoder 120 may apply a verify voltage to the selected word line, and apply a verify pass voltage higher than the verify voltage to the unselected word lines.

In a read operation, the address decoder 120 may apply a read voltage to the selected word line, and apply a pass voltage higher than the read voltage to the unselected word lines.

In an embodiment, an erase operation of the semiconductor memory device 100 is performed in units of memory blocks. In the erase operation, the address ADDR input to the semiconductor memory device 100 may include a block address. The address decoder 120 may decode the block address and select one memory block according to the decoded block address. In the erase operation, the address decoder 120 may apply a ground voltage to word lines coupled to the selected memory block.

In an embodiment, the address decoder 120 may be configured to decode a column address in the address ADDR transmitted thereto. The decoded column address may be transmitted to the read/write circuit 130. As an example, the address decoder 120 may include components such as a row decoder, a column decoder, and an address buffer.

The voltage generating unit 150 is configured to generate a plurality of voltages by using an external power voltage supplied to the semiconductor memory device 100. The voltage generating unit 150 operates in response to the control of the control logic 140.

In an embodiment, the voltage generating unit 150 may generate an internal power voltage by regulating the external power voltage. The internal power voltage generated by the voltage generating unit 150 is used as an operating voltage of the semiconductor memory device 100.

In an embodiment, the voltage generating unit 150 may generate a plurality of voltages by using the external power voltage or the internal power voltage. The voltage generating unit 150 may be configured to generate various voltages required by the semiconductor memory device 100. For example, the voltage generating unit 150 may generate a plurality of program voltages, a plurality of pass voltages, a plurality of select read voltages, and a plurality of unselect read voltages.

For example, the voltage generating unit 150 may include a plurality of pumping capacitors for receiving the internal power voltage, and generate a plurality of voltages by selectively activating the plurality of pumping capacitors in response to the control of the control logic 140.

The plurality of generated voltages may be supplied to the memory cell array 110 by the address decoder 120.

The read/write circuit 130 may include a plurality of page buffers. Each of the page buffers is coupled to the memory cell array 110 through a corresponding bit line BL. The page buffers operate in response to the control of the control logic 140.

The read/write circuit 130 communicates data with the input/output circuit 160. In a program operation, the read/write circuit 130 receives data DATA to be stored through the input/output circuit 160.

In the program operation, when a program pulse is applied to a selected word line, the plurality of page buffers in the read/write circuit 130 may transfer the data DATA received through the input/output circuit 160 to selected memory cells through the bit lines BL. The memory cells of the selected page are programmed according to the transferred data DATA. A memory cell coupled to a bit line to which a program permission voltage (e.g., a ground voltage) is applied may have an increased threshold voltage. The threshold voltage of a memory cell coupled to a bit line to which a program prohibition voltage (e.g., a power voltage) is applied may be maintained. In a program verify operation, the page buffers read page data from the selected memory cells through the bit lines BL.

In a read operation, the read/write circuit 130 read data DATA from the memory cells of the selected page through the bit lines BL, and outputs the read data DATA to the input/output circuit 160.

In an erase operation, the read/write circuit 130 may allow the bit lines BL to be floated. In an embodiment, the read/write circuit 130 may include a column select circuit.

The input/output circuit 160 is coupled to first to mth page buffers PB1 to PBm through data lines DL. The input/output circuit 160 operates in response to the control of the control logic 140. In a program operation, the input/output circuit 160 receives data DATA to be stored from an external controller (not shown). In a read operation, the input/output circuit 160 outputs, to the external controller, data transferred from the first to mth page buffers PB1 to PBm included in the read/write circuit 130.

The control logic 140 may be coupled to the address decoder 120, the voltage generating unit 150, the read/write circuit 130, the ready busy signal generator 170, and the input/output circuit 160. The control logic 140 may be configured to control overall operations of the semiconductor memory device 100. The control logic 140 may operate in response to a command CMD transmitted from an external device.

The ready busy signal generator 170 outputs a ready busy signal RnB indicating whether the semiconductor memory device 100 corresponds to the ready status or the busy status. To this end, the control logic 140 transfers a status read control signal C_SR to the ready busy signal generator 170. The ready busy signal generator 170 may output the ready busy signal RnB to the controller 200 through a path separate from the input/output circuit 160, based on the status read control signal C_SR, but this is merely illustrative. In another embodiment, the ready busy signal generator 170 may output the ready busy signal RnB to the controller 200 via the input/output circuit 160. In this case, the input/output circuit 160 may output any one of a ready signal or a busy signal.

In FIG. 4, the ready busy signal generator 170 is illustrated as a component provided separate and independent from the control logic 140. However, this is merely illustrative; the ready busy signal generator 170 may be included in the control logic 140.

An interface may interface data communication between the semiconductor memory device 100 and the external device. The interface may include a NAND interface or a NOR interface depending on the kind of the semiconductor memory device 100.

The ready busy signal RnB generated from the ready busy signal generator 170 may be output to the controller 200 through the ready busy line.

As an example, that the ready busy signal RnB is disabled as logical value 'high' may mean that the semiconductor memory device 100 corresponds to the ready status, and that the ready busy signal RnB is enabled as logical value 'low' may mean that the semiconductor memory device 100 corresponds to the busy status. As another example, that an output node of the ready busy signal RnB has a high impedance may mean that the semiconductor memory device 100 corresponds to the ready status, and that the output node of the ready busy signal RnB has a low impedance may mean that the semiconductor memory device 100 corresponds to the busy status.

As shown in FIG. 4, the semiconductor memory device 100 is generally configured to output the ready busy signal RnB as the external ready busy signal to the controller 200. In this case, since the ready busy signal RnB transferred to the controller 200 is the external ready busy signal, the controller 200 cannot determine an accurate internal operation status of the semiconductor memory device 100 when the external ready busy signal and the internal ready busy signal represent different statuses of the semiconductor memory device 100.

Figure 6:
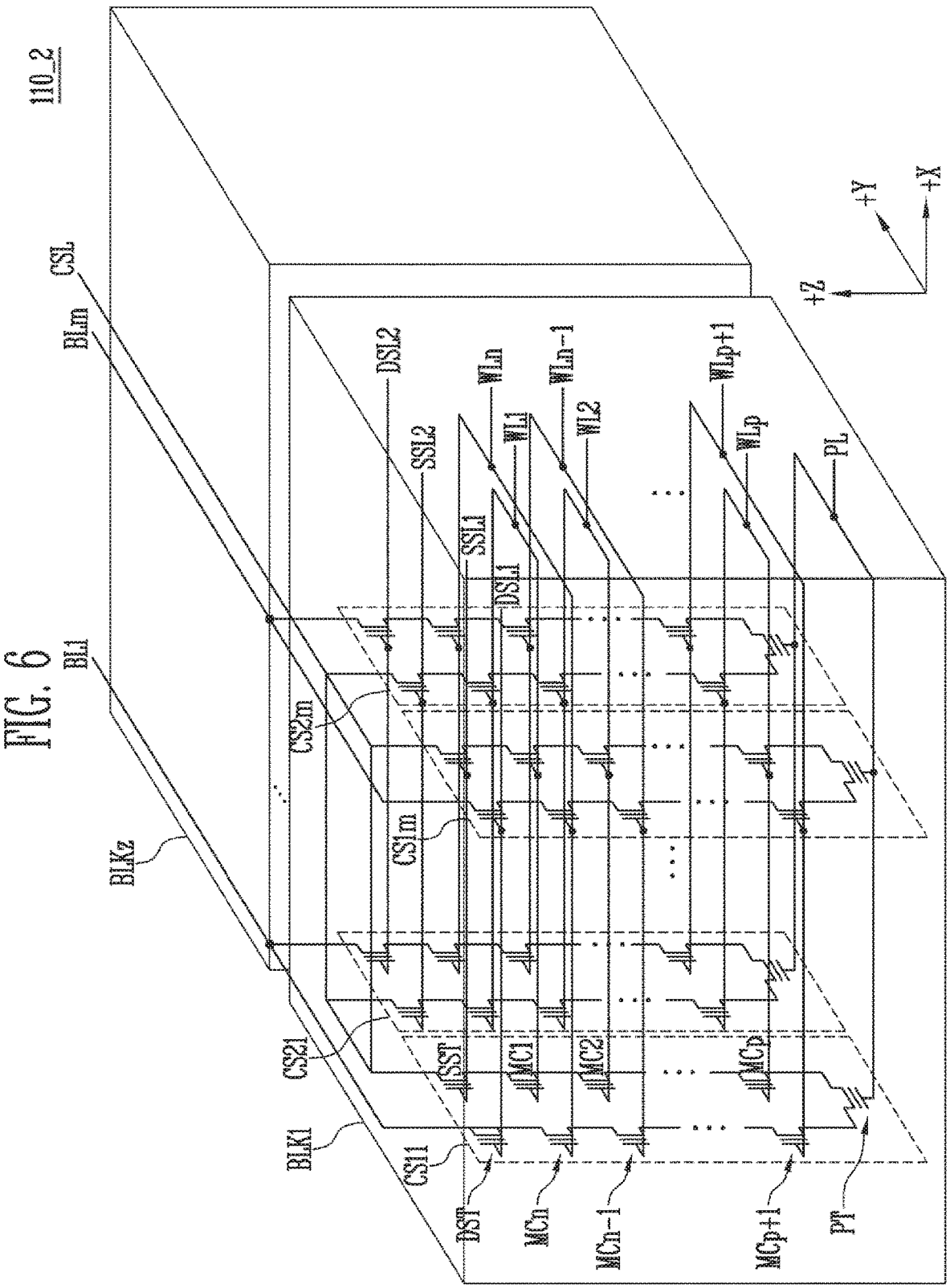
FIG. 6 is a diagram illustrating another embodiment of the memory cell array of FIG. 4.

FIG. 6 is a diagram illustrating another embodiment of the memory cell array 110 of FIG. 4. In FIG. 6, the memory cell array is identified by the reference numeral 110_2.

Referring to FIG. 6, the memory cell array 110_2 may include a plurality of memory blocks BLK1 to BLKz. In FIG. 6, for convenience of description, an internal configuration of a first memory block BLK1 is illustrated, and internal configurations of the other memory blocks BLK2 to BLKz are omitted. It will be understood that second to zth memory blocks BLK2 to BLKz are configured identically to the first memory block BLK1.

The first memory block BLK1 may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the first memory block BLK1, m cell strings are arranged in a row direction (i.e., a +X direction). In FIG. 4, it is illustrated that two cell strings are arranged in a column direction (i.e., a +Y direction). However, this is for convenience of description; it will be understood that three or more cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

Each of the SSTs may have a similar structure, each of the DSTs may have a similar structure, and each of the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 6, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in a direction opposite to +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

In an embodiment, at least one of the first to nth memory cells MC1 to MCn may be used as a dummy memory cell. When the dummy memory cell is provided, the voltage or current of a corresponding cell string can be stably controlled. Accordingly, the reliability of data stored in the first memory block BLK is improved.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 6, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

Figure 7:
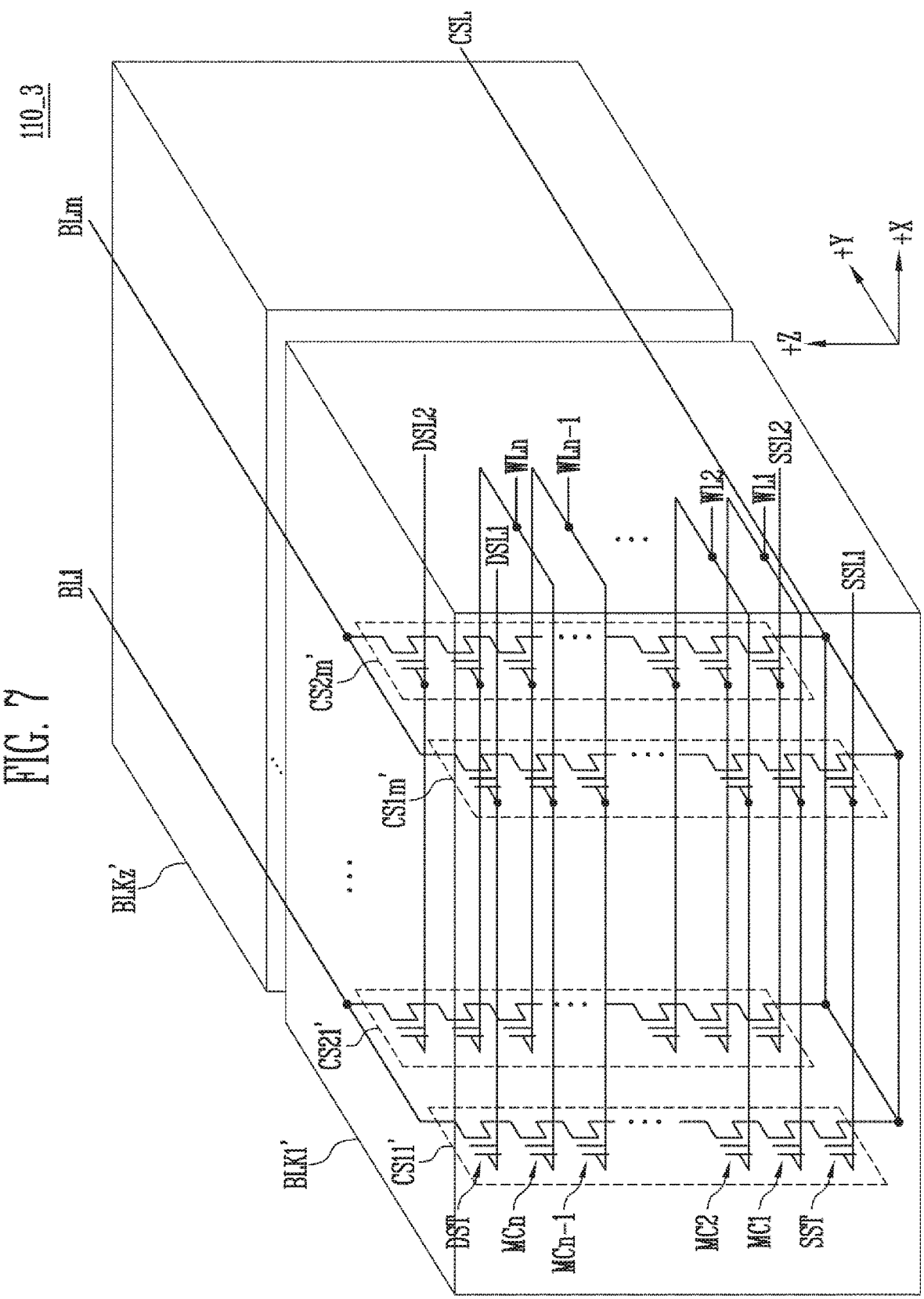
FIG. 7 is a diagram illustrating still another embodiment of the memory cell array of FIG. 4.

FIG. 7 is a diagram illustrating still another embodiment of the memory cell array 100 of FIG. 4. In FIG. 7, the memory cell array is identified by the reference numeral 110_3.

Referring to FIG. 7, the memory cell array 110_3 may include a plurality of memory blocks BLK1' to BLKz'. In FIG. 7, for convenience of description, an internal configuration of a first memory block BLK1' is illustrated, and internal configurations of the other memory blocks BLK2' to BLKz' are omitted. It will be understood that second to zth memory blocks BLK2' to BLKz' are configured identically to the first memory block BLK1'.

The first memory block BLK1' may include a plurality of cell strings CS11' to CS1m' and CS21' to CS2m'. Each of the plurality of cell strings CS11' to CS1m' and CS21' to CS2m' extends along the +Z direction. In the first memory block BLK1', m cell strings are arranged in the +X direction. In FIG. 7, it is illustrated that two cell strings are arranged in the +Y direction. However, this is for convenience of description; it will be understood that three or more cell strings may be arranged in the column direction.

Each of the plurality of cell strings CS11' to CS1m and CS21' to CS2m' may include at least one source select transistor SST, first to nth memory cells MC1 to MCn, and at least one drain select transistor DST.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLK1° of FIG. 7 has a circuit similar to that of the memory block BLK1 of FIG. 6, except that the pipe transistor PT is excluded from each cell string.

Figure 8:
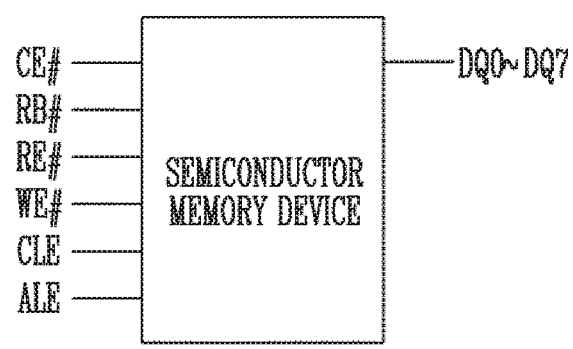
FIG. 8 is a diagram illustrating a pin configuration of the semiconductor memory device in accordance with an embodiment of the present disclosure.

FIG. 8 is a diagram illustrating a pin configuration of the semiconductor memory device 100 in accordance with an embodiment of the present disclosure.

Referring to FIG. 8, the semiconductor memory device 100 communicates with an external controller through a plurality of lines.

The semiconductor memory device 100 communicates with the controller through a chip enable line CE#, a command latch enable line CLE, an address latch enable line ALE, a write enable line WE#, a read enable line RE#, a ready busy line RB#, and data input/output lines DQ0 to DQ7.

A signal of the chip enable line CE# indicates that the semiconductor memory device 100 is operable. The signal of the chip enable line CE# may be selectively applied to storage devices coupled to the same channel. As the signal of the chip enable line CE# becomes low, the signal of the chip enable line CE# indicates that all operations in a corresponding chip are possible. If the signal of the chip enable line CE# is high, the signal of the chip enable line CE# indicates that the corresponding chip is in a standby status.

As a signal of the ready busy line RB# becomes low while an operation in the chip is being performed, the signal of the ready busy line RB# indicates that the chip does not transmit/receive any signal to/from the outside. If the signal of the ready busy line RB# is high, the signal of the ready busy line RB# indicates that the chip is in a ready status.

A signal of the command latch enable line CLE becomes high while a command CMD is being input to a selected storage device. A signal of the address latch enable signal ALE becomes high while an address ADD is being input to the selected storage device.

The command CMD and the address ADD are input to the selected storage device when a signal of the write enable line WE# is changed from high to low.

The signal of the write enable line WE# is toggled when the command and the address are loaded to the storage device. The signal of the write enable line WE# is toggled when data is loaded to the controller.

The data input/output lines DQ0 to DQ7 allow a command, an address, and data to be input to the semiconductor memory device 100, or allow data to be output from the semiconductor memory device 100 to the controller. Since the data is configured with 8 bits, the number of the data input/output lines DQ0 to DQ7 is 8. However, the number of the data input/output lines is not limited to 8. In various embodiments, the number of the data input/output lines may be extended to 16 or 32.

According to an embodiment of the present disclosure, the internal ready busy signal can be output through the ready busy line RB#, if necessary, as well as the external ready busy signal. According to an embodiment of the present disclosure, the semiconductor memory device 100 for selectively outputting the external ready busy signal and the internal ready busy signal and an operation method of the semiconductor memory device will be described later with reference to FIGS. 12 to 16.

Figure 9:
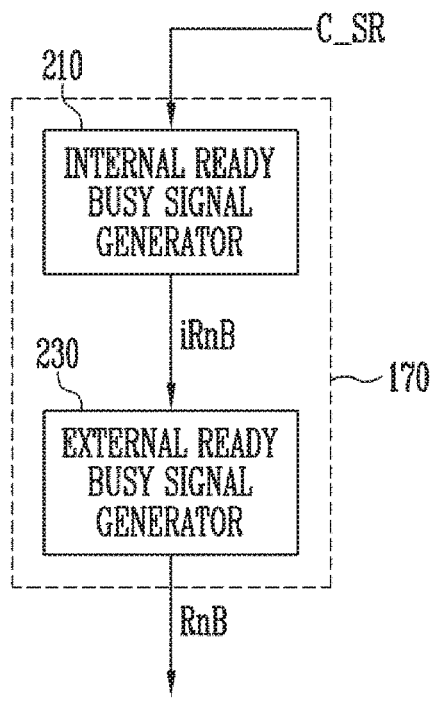
FIG. 9 is a block diagram illustrating an embodiment of a ready busy signal generator of FIG. 4.

FIG. 9 is a block diagram illustrating an embodiment of the ready busy signal generator 170 of FIG. 4.

Referring to FIG. 9, the ready busy signal generator 170 may include an internal ready busy signal generator 210 and an external ready busy signal generator 230.

The internal ready busy signal generator 210 receives the status read control signal C_SR from the control logic 140. The internal ready busy signal generator 210 generates an internal ready busy signal iRnB, based on the status read control signal C_SR. The internal ready busy signal iRnB may be a signal indicating whether an actual operation on the memory cell array 110 is being performed in the semiconductor memory device 100.

The external ready busy signal generator 230 receives the internal ready busy signal iRnB. Also, the external ready busy signal generator 230 generates the ready busy signal RnB, based on the internal ready busy signal iRnB. As described above, the ready busy signal RnB is an external ready busy signal. The ready busy signal RnB may be a signal indicating whether the semiconductor memory device 100 is ready to receive a subsequent command CMD from the controller 200.

The semiconductor memory device 100 may receive a subsequent command from the controller 200 even when an operation on the memory cell array 110 is being performed in the semiconductor memory device 100. In this case, the internal ready busy signal iRnB may indicate the busy status while the external ready busy signal RnB may indicate the ready status. That is, there is a situation in which the internal ready busy signal iRnB and the external ready busy signal RnB represent different statuses of the semiconductor memory device 100. The case where the internal ready busy signal iRnB and the external ready busy signal RnB represent different statuses of the semiconductor memory device 100 will be described later with reference to FIG. 11.

Figure 10:
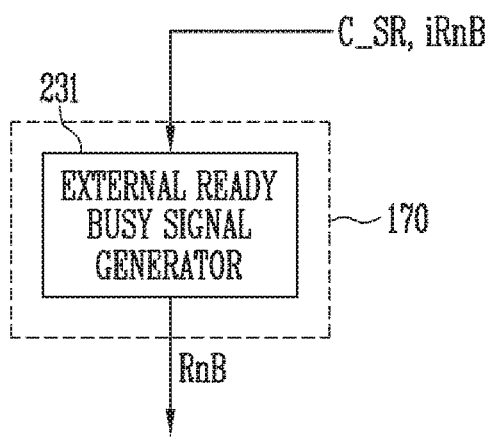
FIG. 10 is a block diagram illustrating another embodiment of the ready busy signal generator of FIG. 4.

FIG. 10 is a block diagram illustrating another embodiment of the ready busy signal generator 170 of FIG. 4.

Referring to FIG. 10, the ready busy signal generator 170 may include an external ready busy signal generator 231. Unlike the embodiment of FIG. 9, the ready busy signal generator 170 of FIG. 10 does not include the internal ready busy signal generator 210. In this case, the internal ready busy signal iRnB may be generated by the control logic 140 to be transferred to the ready busy signal generator 170. The external ready busy signal generator 231 may generate the ready busy signal RnB, based on the status read control signal C_SR and the internal ready busy signal iRnB.

Figure 11:
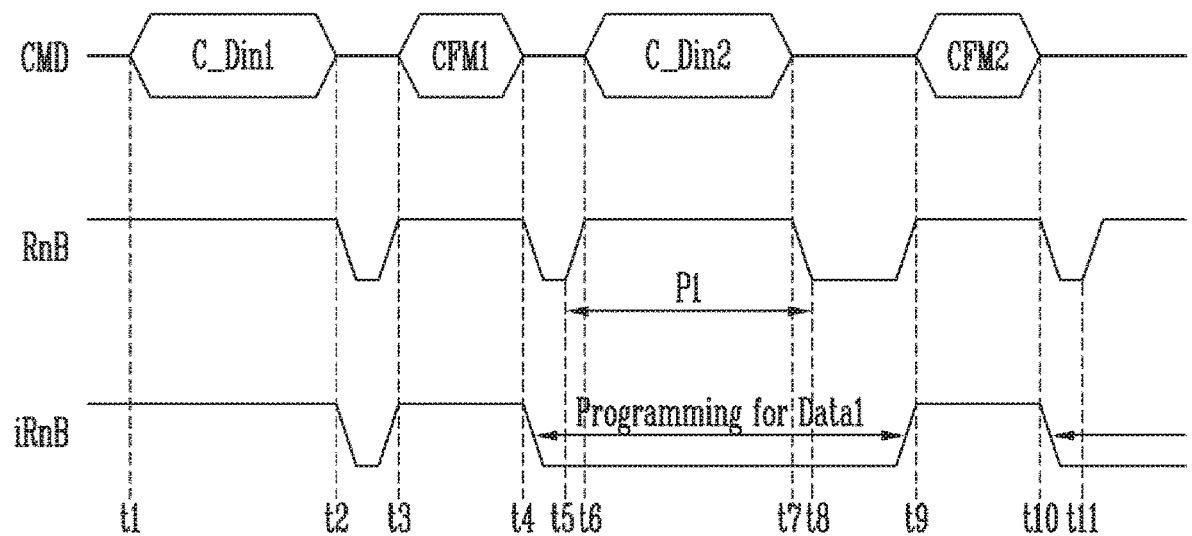
FIG. 11 is a timing diagram illustrating a command, a ready busy signal, and an internal ready busy signal as a program operation is performed in accordance with an embodiment of the present disclosure.

FIG. 11 is a timing diagram illustrating a command CMD, a ready busy signal RnB, and an internal ready busy signal iRnB as a program operation is performed in accordance with an embodiment of the present disclosure.

Referring to FIG. 11, at a first time point t1, the controller 200 transfers a first data input command C_Din1 to the semiconductor memory device 100. The first data input command C_Din1 may indicate that first data (Data1) has been input and is to be first programmed. That is, data to be programmed and an address may be transferred to the semiconductor memory device 100 between the first time point t1 and a second time point t2.

The semiconductor memory device 100 may maintain the ready busy signal RnB at a high-level representing the ready status of the semiconductor memory device 100 between the first time point t1 and the second time point t2. The internal ready busy signal iRnB may indicate whether an operation is being performed in the semiconductor memory device 100, separate from the ready busy signal RnB output to the controller 200. Accordingly, the internal ready busy signal iRnB can be maintained at the high-level ready status to indicate the ready status of the semiconductor memory device 100 between the first time point t1 and the second time point t2.

Data1 transferred from the controller 200 to the semiconductor memory device 100 through the input/output lines DQ0 to DQ7 may be stored in a cache latch (not shown). Although not shown in FIG. 4, the cache latch may be included in the input/output circuit 160.

As the transfer of the first data input command C_Din1 to the semiconductor memory device 100 is completed at the second time point t2, the semiconductor memory device 100 may transfer Data1 from the cache latch to the read/write circuit 130. The internal ready busy signal iRnB is changed to a low-level to represent the busy status of the semiconductor memory device 100 while Data1 is being transferred from the cache latch to the read/write circuit 130, i.e., from the second time point t2 to a third time point t3.

The ready busy signal RnB is also changed to the low-level to represent the busy status of the semiconductor memory device 100 from the second time point t2 to a third time point t3.

If the transfer of Data1 to the read/write circuit 130 is completed at the third time point t3, each of the internal ready busy signal iRnB and the ready busy signal RnB is changed to the high-level indicating the ready status of the semiconductor memory device 100.

As the ready busy signal RnB is changed to the high-level indicating the ready status of the semiconductor memory device 100 at the third time point t3, the controller 200 transfers a first confirmation command CFM1 to the semiconductor memory device 100.

As the first confirmation command CFM1 is received through the input/output lines DQ0 to DQ7 at a fourth time point t4, the semiconductor memory device 100 starts performing a program operation on Data1. The internal ready busy signal iRnB of the semiconductor memory device 100 is changed to the low-level representing the busy status of the semiconductor memory device 100. When a program of a first program loop is started, the semiconductor memory device 100 changes the ready busy signal RnB to the low-level representing the busy status of the semiconductor memory device 100.

If the cache latch is ready to receive data while the program of the first program loop is being performed between a fifth time point t5 and a sixth time point t6, the semiconductor memory device 100 changes the ready busy signal RnB to the high-level representing the ready status of the semiconductor memory device 100.

As the ready busy signal RnB is changed to a high-level representing the ready status of the semiconductor memory device 100 at the sixth time point t6, the controller 200 transfers a second data input command C_Din2 to the semiconductor memory device 100. The second data input command C_Din2 may indicate that second data is to be programmed. That is, second data to be programmed and an address may be transferred to the semiconductor memory device 100 between the sixth time point t6 and a seventh time point t7. The second data transferred from the controller 200 to the semiconductor memory device 100 may be stored in the cache latch (not shown).

If the transfer of the second data input command C_Din2 to the semiconductor memory device 100 is completed at the seventh time point t7, the second data may be stored in the cache latch of the semiconductor memory device 100.

However, since the program operation on the first data (Data1) is not completed and the cache latch stores the second data (Data2), the semiconductor memory device 100 cannot receive additional commands from the controller 200. Therefore, the ready busy signal RnB maintains the low-level representing busy status of the semiconductor memory device 100 during an eighth time point t8 to a ninth time point t9.

If the program operation on Data1 is completed at the ninth time point t9, each of the internal ready busy signal iRnB and the ready busy signal RnB is changed to a high-level representing the ready status of the semiconductor memory device 100. Since the ready busy signal RnB is changed to a high-level representing the ready status of the semiconductor memory device 100 at the ninth time point t9, the controller 200 transfers a second confirmation command CFM2 for the second data to the semiconductor memory device 100.

As the second confirmation command CFM2 is received through the input/output lines DQ0 to DQ7 at a tenth time point t10, the semiconductor memory device 100 starts performing a program operation on the second data. The internal ready busy signal iRnB is changed to the low-level representing the busy status of the semiconductor memory device 100. When the program operation on the second data is started, the semiconductor memory device 100 changes the ready busy signal RnB to the low-level representing the busy status of the semiconductor memory device 100.

At the tenth time point t10 when the cache latch is ready to receive data while the program operation on the second data is being performed, the semiconductor memory device 100 changes the ready busy signal RnB to the high-level representing the ready status of the semiconductor memory device 100.

As described with reference to FIG. 11, the internal ready busy signal iRnB has a level different from that of the ready busy signal RnB in a period P1, which is between the fifth time point t5 and the eighth time point t8.

In the semiconductor memory device 100, only the ready busy signal RnB is generally transferred to the controller 200. Therefore, the controller 200 cannot use information on whether a detailed internal operation of the semiconductor memory device 100 is being performed. As will be described later, in the semiconductor memory device and the operating method thereof according to the present disclosure, the semiconductor memory device 100 can selectively output the internal ready busy signal iRnB and the external ready busy signal RnB according to a command of the controller 200. Accordingly, an operation of the memory system including the semiconductor memory device 100 and the controller 200 can be flexibly controlled.

Figure 12:
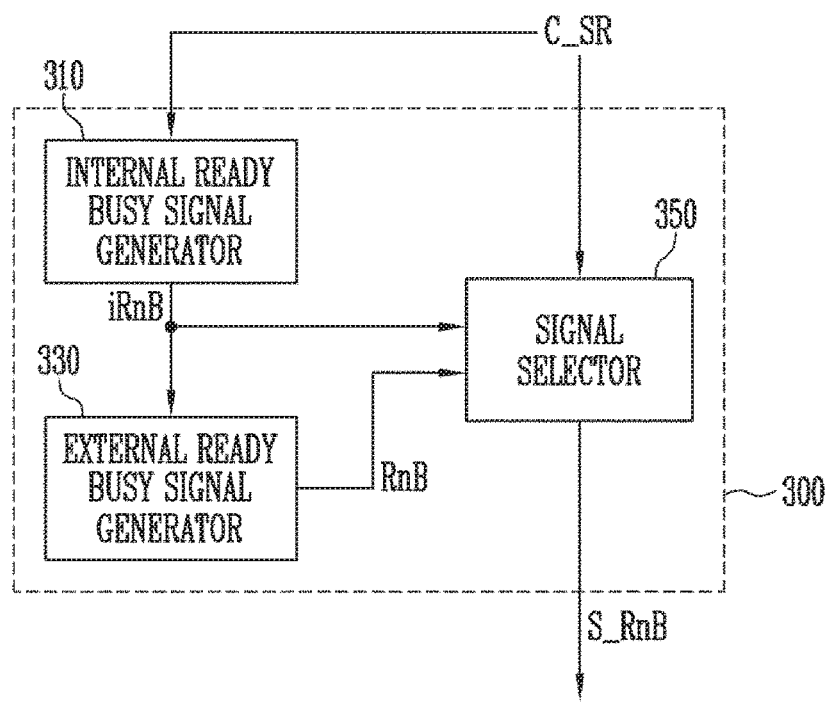
FIG. 12 is a block diagram illustrating an embodiment of the ready busy signal generator included in the semiconductor memory device.

FIG. 12 is a block diagram illustrating an embodiment of the ready busy signal generator 300 included in the semiconductor memory device 100.

Referring to FIG. 12, the ready busy signal generator 300 may substitute for the ready busy signal generator 170 shown in FIGS. 4 and 9. The ready busy signal generator 300 according to an embodiment of the present disclosure may include an internal ready busy signal generator 310, an external ready busy signal generator 330 and a signal selector 350.

The internal ready busy signal generator 310 receives a status read control signal C_SR from the control logic 140. The internal ready busy signal generator 310 generates an internal ready busy signal iRnB based on the status read control signal C_SR. The internal ready busy signal iRnB may be a signal indicating whether an actual operation on the memory cell array 110 is being performed in the semiconductor memory device 100. The external ready busy signal generator 330 receives the internal ready busy signal iRnB. Also, the external ready busy signal generator 330 generates a ready busy signal RnB based on the internal ready busy signal iRnB. As described above, the ready busy signal RnB is an external ready busy signal. The ready busy signal RnB may be a signal indicating whether the semiconductor memory device 100 is ready to receive a subsequent command CMD from the controller 200.

The signal selector 350 receives the internal ready busy signal iRnB and the ready busy signal RnB from the internal ready busy signal generator 310 and the external ready busy signal generator 330, respectively. Also, the signal selector 350 selects one of the internal ready busy signal iRnB and the ready busy signal RnB and outputs the selected signal as a selected ready busy signal S_RnB based on the status read control signal C_SR.

The status read control signal C_SR is transferred from the control logic 140. The control logic 140 may generate the status read control signal C_SR based on a command transferred from the controller 200. For example, when a command requesting the internal ready busy signal iRnB to be output is received from the controller 200, the control logic 140 may enable the status read control signal C_SR. The output of the selected ready busy signal as the status read control signal C_SR is enabled or disabled will be described later with reference to FIGS. 15A and 15B.

Figure 13:
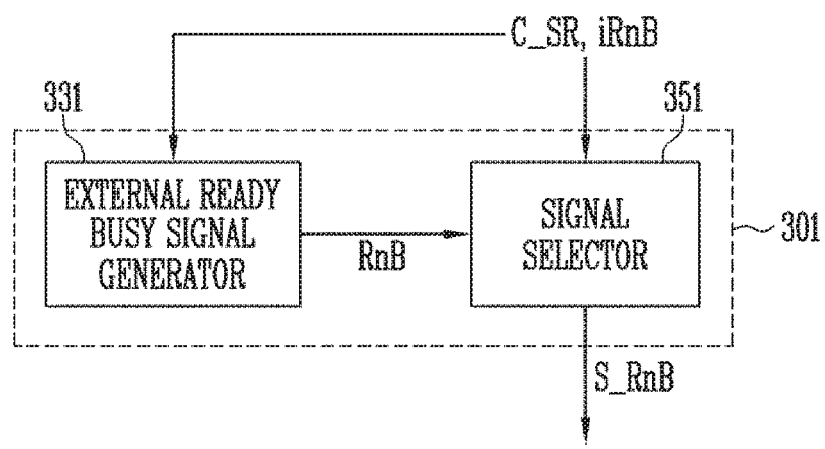
FIG. 13 is a block diagram illustrating another embodiment of the ready busy signal generator included in the semiconductor memory device.

FIG. 13 is a block diagram illustrating another embodiment of the ready busy signal generator 301 included in the semiconductor memory device.

Referring to FIG. 13, the ready busy signal generator 301 may substitute for the ready busy signal generator 170 shown in FIGS. 4 and 9. The ready busy signal generator 301 according to an embodiment of the present disclosure may include an external ready busy signal generator 331 and a signal selector 351m. Unlike the ready busy signal generator 300 of FIG. 12, the ready busy signal generator 301 does not include the internal ready busy signal generator 310. In this case, the internal ready busy signal iRnB may be generated by the control logic 140 to be transferred to the ready busy signal generator 301. The external ready busy signal generator 331 may generate the ready busy signal RnB based on a status read control signal C_SR and the internal ready busy signal iRnB.

The signal selector 351 receives the internal ready busy signal iRnB and the ready busy signal RnB from the control logic 140 and the external ready busy signal generator 331, respectively. Also, the signal selector 351 selects one of the internal ready busy signal iRnB and the ready busy signal RnB and outputs the selected signal as a selected ready busy signal S_RnB based on the status read control signal C_SR.

Figure 14:
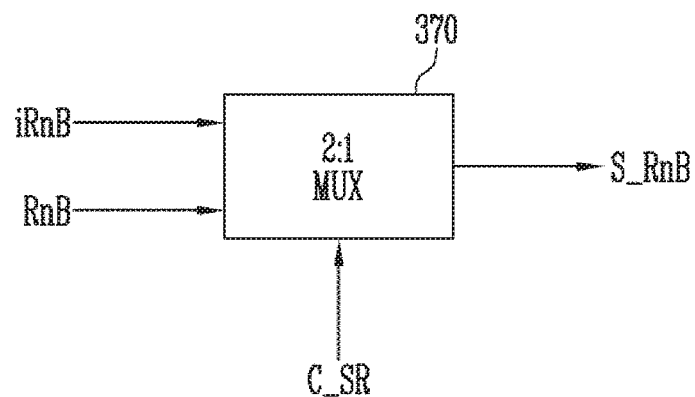
FIG. 14 is a block diagram illustrating an embodiment a signal selector shown in FIG. 12 or 13.
Figure 15A:
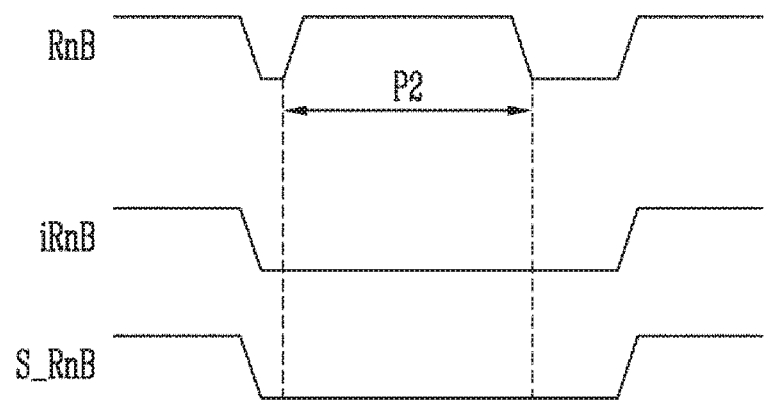
FIGS. 15A and 15B are timing diagrams illustrating a selected ready busy signal according to a state read control signal in accordance with an embodiment of the present disclosure.
Figure 15B:
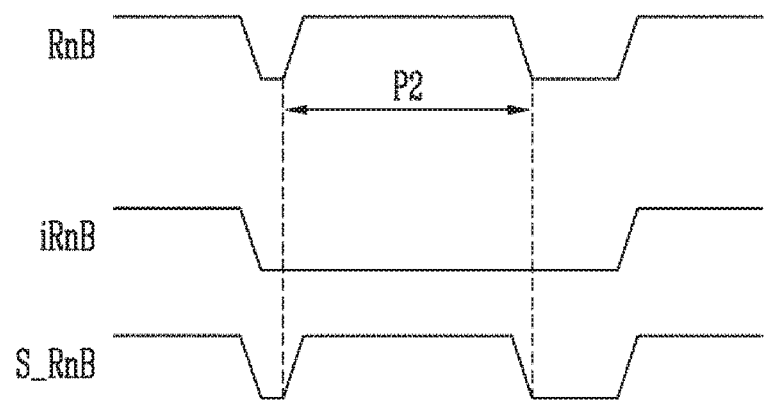

FIG. 14 is a block diagram illustrating an embodiment the signal selector 350 or 351 shown in FIG. 12 or 13. FIGS. 15A and 15B are timing diagrams illustrating the selected ready busy signal according to the status read control signal C_SR.

Referring to FIG. 14, the signal selector 350 or 351 may be configured as a multiplexer 370. As an example, the multiplexer 370 is a 2:1 multiplexer that receives two input signals and outputs one output signal. The multiplexer 370 receives the internal ready busy signal iRnB and the ready busy signal RnB. The multiplexer 370 also receives the status read control signal C_SR as a control signal. The multiplexer 370 selects one of the internal ready busy signal iRnB and the ready busy signal RnB based on the voltage level of the status read control signal C_SR, and outputs the selected signal as the selected ready busy signal S_RnB.

Referring together to FIGS. 14 and 15A, when the status read control signal C_SR is enabled, the multiplexer 370 selects the internal ready busy signal iRnB and outputs the internal ready busy signal iRnB as the selected ready busy signal S_RnB. Therefore, as shown in FIG. 15A, the internal ready busy signal iRnB as the selected ready busy signal S_RnB may be transferred to the controller 200 in the period P2 in which the internal ready busy signal iRnB and the ready busy signal RnB represent different statuses of the semiconductor memory device 100

Referring together to FIGS. 14 and 15B, when the status read control signal C_SR is disabled, the multiplexer 370 selects the ready busy signal RnB and outputs the ready busy signal RnB as the selected ready busy signal S_RnB. Therefore, as shown in FIG. 15B, the ready busy signal RnB as the selected ready busy signal S_RnB may be transferred to the controller 200 in the period P2 in which the internal ready busy signal iRnB and the ready busy signal RnB represent different statuses of the semiconductor memory device 100.

As described above, the semiconductor memory device according to the present disclosure may include the ready busy signal generator 300 or 301 that selectively outputs the ready busy signal RnB and the internal ready busy signal iRnB. Thus, the ready busy signal RnB or the internal ready busy signal iRnB is selectively output according to a command received from the controller 200. Accordingly, the operational flexibility of the memory system is enhanced.

Figure 16:
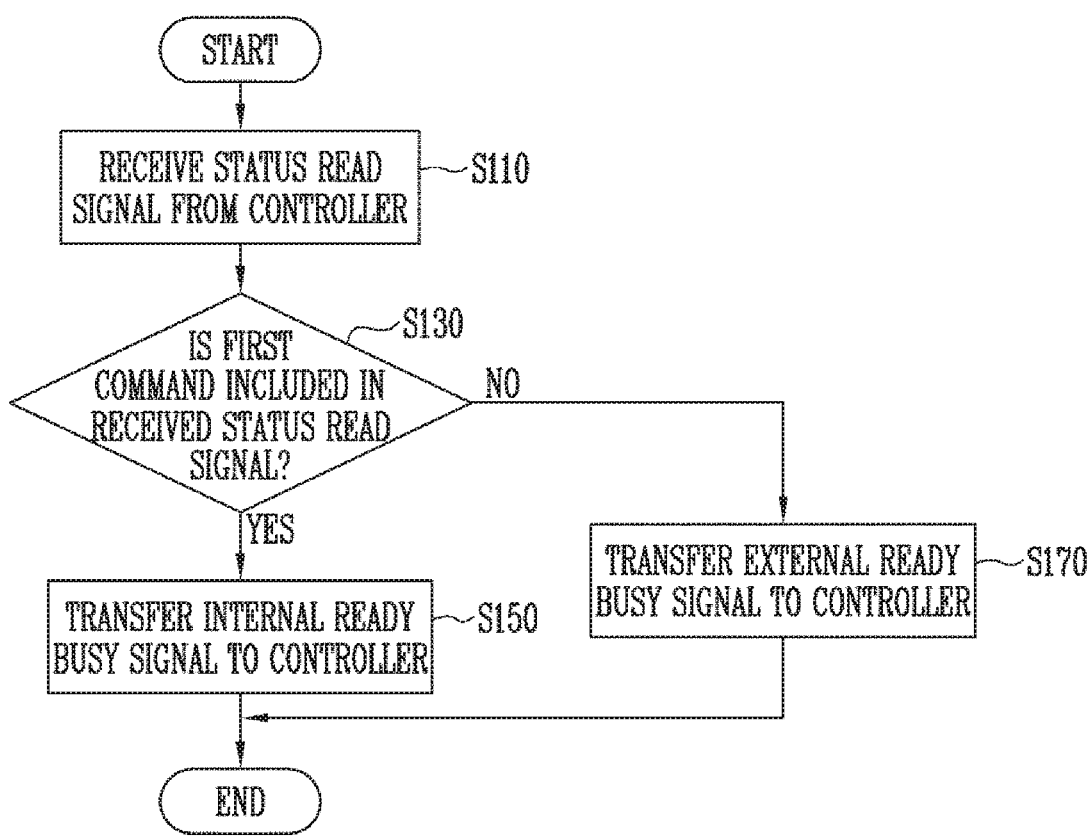
FIG. 16 is a flowchart describing an operating method of the semiconductor memory device according to an embodiment of the present disclosure.

FIG. 16 is a flowchart illustrating an operating method of the semiconductor memory device 100 according to an embodiment of the present disclosure.

Referring to FIG. 16, the semiconductor memory device 100 receives a status read signal SRS from the controller 200 at step S110. As shown in FIG. 3, the controller 200 transfers the status read signal SRS to determine an operation status of the semiconductor memory device 100.

Then, the semiconductor memory device 100 determines whether a first command is included in the received status read signal SRS at step S130. In the step S130, the first command may be a command for requesting an internal ready busy signal to be transferred. That is, the control logic 140 of the semiconductor memory device 100 generates a status read control signal C_SR by determining whether the first command is included in the received status read signal SRS.

When the first command is included in the status read signal SRS (that is, "YES" at step S130), the control logic 140 allows the status read control signal C_SR to be enabled and transfers the enabled status read control signal C_SR to the ready busy signal generator 300 or 301. Accordingly, the signal selector 351 selects an internal ready busy signal iRnB and transfers the selected internal ready busy signal iRnB as a selected ready busy signal S_RnB to the controller 200 at step S150.

When the first command is not included in the status read signal SRS (that is, "NO" at step S130), the control logic 140 allows the status read control signal C_SR to be disabled and transfers the disabled status read control signal C_SR to the ready busy signal generator 300 or 301. Accordingly, the signal selector 351 selects a ready busy signal RnB and transfers the selected ready busy signal RnB to the controller 200. Thus, an external ready busy signal is transferred to the controller 200 at step S170.

Figure 17:
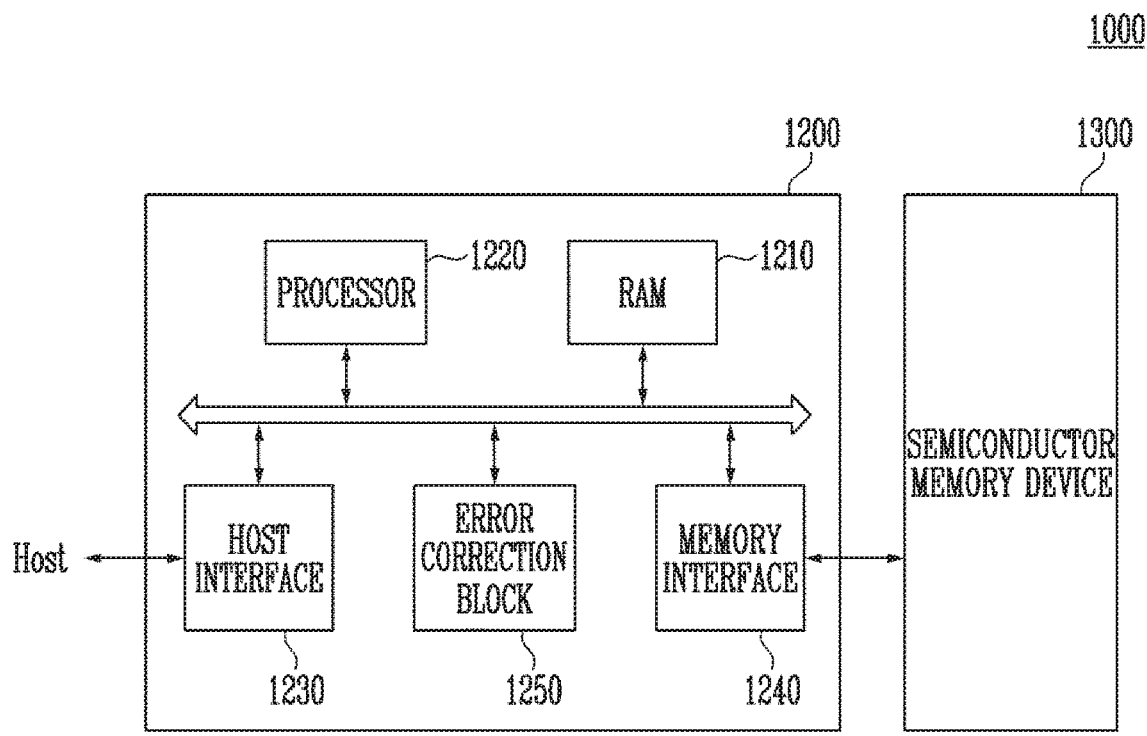
FIG. 17 is a block diagram illustrating a memory system including a semiconductor memory device according to an embodiment of the present disclosure.

FIG. 17 is a block diagram illustrating a memory system 1000 including a semiconductor memory device according to an embodiment of the present disclosure.

Referring to FIG. 17, the memory system 1000 may include a semiconductor memory device 1300 and a controller 1200.

The semiconductor memory device 1300 may be the semiconductor memory device 100 described with reference to FIG. 4, and may be a semiconductor memory including the ready busy signal generator shown in FIG. 12 or 13. Thus, overlapping description is omitted below.

The controller 1200 is coupled to a host (Host) and the semiconductor memory device 1300. The controller 1200 is configured to access the semiconductor memory device 1300 in response to a request from the host. For example, the controller 1200 is configured to control read, write, erase, and background operations of the semiconductor memory device 1300. The controller 1200 is configured to provide an interface between the semiconductor memory device 1300 and the host. The controller 1200 is configured to drive firmware for controlling the semiconductor memory device 1300.

The controller 1200 may include a random access memory (RAM) 1210, a processor 1220, a host interface 1230, a memory interface 1240, and an error correction block 1250.

The RAM 1210 is used as at least one of an operation memory of the processor 1220, a cache memory between the semiconductor memory device 1300 and the host, and a buffer memory between the semiconductor memory device 1300 and the host.

The processor 1220 controls overall operations of the controller 1200. The processor 1220 is configured to control read, program, erase, and background operations of the semiconductor memory device 1300. The processor 1220 is configured to drive firmware for controlling the semiconductor memory device 1300. The processor 1220 may perform a function of a flash translation layer (FTL). The processor 1220 may convert a logical block address (LBA) provided by the host into a PBA through the FTL. The FTL may receive an LBA using a mapping table to convert the LBA into a PBA. There are various address mapping methods of the FTL according to mapping units. Representative address mapping methods include a page mapping method, a block mapping method, and a hybrid mapping method.

The processor 1220 is configured to randomize data received from the host. For example, the processor 1220 may randomize the data received from the host by using a randomizing seed. The randomized data is provided as data to be stored to the semiconductor memory device 1300 and to be programmed in a memory cell array.

The processor 1220 is configured to derandomize data received from the semiconductor memory device 1300 in a read operation that is performed. For example, the processor 1220 may de-randomize the data received from the semiconductor memory device 1300 by using a derandomizing seed. The derandomized data may be output to the host.

In an embodiment, the processor 1220 may perform randomizing and derandomizing by driving software or firmware.

The host interface 1230 may include a protocol for exchanging data between the host Host and the controller 1200. As an embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 1300. For example, the memory interface 1240 may include a NAND interface or a NOR interface.

The error correction block 1250 is configured to detect and correct an error of data received from the semiconductor memory device 1300 by using an error correction code (ECC). The error correction block 1250 may correct an error with respect to read page data by using the ECC. The error correction block 1250 may correct an error by using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation, Hamming code, or other suitable technique.

In a read operation, the error correction block 1250 may correct an error of a read page data. When the number error bits in the read page data exceeds the number correctable bits, decoding may fail. When the number of error bits in the read page data is less than or equal to of the number of correctable bits, the decoding may succeed. The success of the decoding represents that a corresponding read command has passed. The failure of the decoding represents that the corresponding read command has failed. When the decoding succeeds, the controller 1200 outputs page data; any error in such data is corrected by the host.

The controller 1200 and the semiconductor memory device 1300 may be integrated into a single semiconductor device. In an embodiment, the controller 1200 and the semiconductor memory device 1300 may be so integrated into a memory card, such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 1300 may be integrated into a single semiconductor device to constitute a semiconductor drive (solid state drive (SSD)), which includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment. Moreover, the memory system 1000 may be provided as one of various electronic devices that constitute a home network, one of various electronic devices that constitute a computer network, one of various electronic devices that constitute a telemetics network, an RFID device, or one of various components that constitute a computing system.

In an embodiment, the semiconductor memory device 1300 or the memory system 1000 may be packaged in various forms. For example, the semiconductor memory device 1300 or the memory system 1000 may be packaged as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 18:
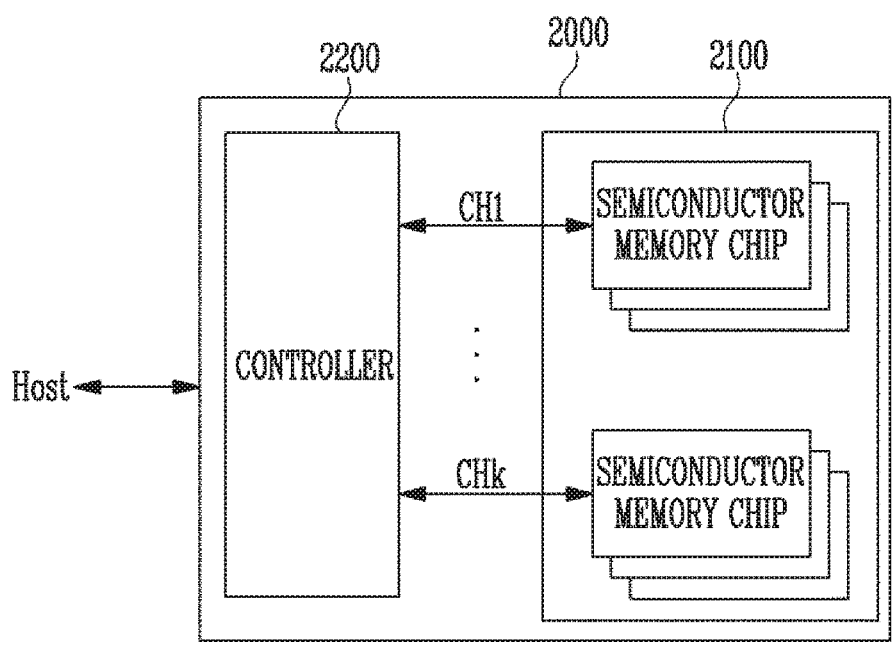
FIG. 18 is a block diagram illustrating an application example of the memory system of FIG. 17.

FIG. 18 is a block diagram illustrating an exemplary application 2000 of the memory system of FIG. 17.

Referring to FIG. 18, the memory system 2000 may include a semiconductor memory device 2100 and a controller 2200. The semiconductor memory device 2100 may include a plurality of semiconductor memory chips. The plurality of semiconductor memory chips are divided into a plurality of groups.

FIG. 18 shows that the plurality of groups communicate with the controller 2200 through first to kth channels CH1 to CHk, respectively. Each semiconductor memory chip may be configured and operated identically to the semiconductor memory device 1300 described with reference to FIG. 17.

Each group is configured to communicate with the controller 2200 through one common channel. The controller 2200 is configured similarly to the controller 1200 described with reference to FIG. 17. The controller 2200 is configured to control the plurality of memory chips of the semiconductor memory device 2100 through the plurality of channels CH1 to CHk.

FIG. 18 shows that a plurality of semiconductor memory chips in a particular group are coupled to one channel. However, the memory system 2000 may be modified such that each semiconductor memory chip in a group is coupled to one channel.

Figure 19:
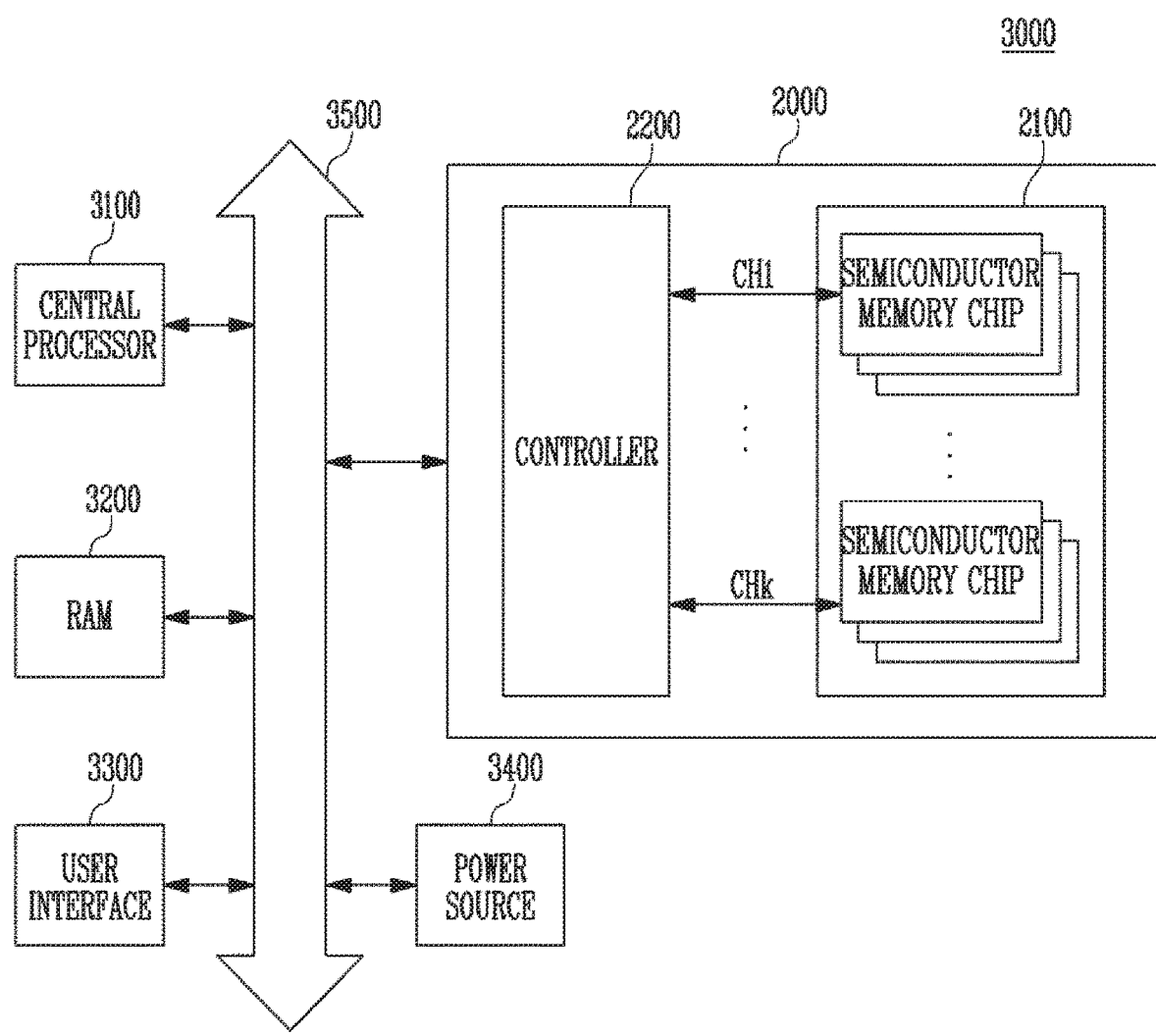
FIG. 19 is a block diagram illustrating a computing system including the memory system described with reference to FIG. 18 in accordance with an embodiment of the disclosure.

FIG. 19 is a block diagram illustrating a computing system including the memory system described with reference to FIG. 18.

Referring to FIG. 19, the computing system 3000 may include a central processor 3100, a RAM 3200, a user interface 3300, a power source 3400, a system bus 3500, and the memory system 2000.

The memory system 2000 is electrically coupled to the central processor 3100, the RAM 3200, the user interface 3300, and the power source 3400 through the system bus 3500. Data supplied through user interface 3300 or data processed by the central processor 3100 are stored in the memory system 2000.

In FIG. 19, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processor 3100 and the RAM 3200.

In FIG. 19, it is illustrated that the memory system 2000 described with reference to FIG. 18 is provided. However, the memory system 2000 in FIG. 19 may be the memory system 1000 described with reference to FIG. 17. In an embodiment, the computing system 3000 may be configured to include both the memory systems 1000 and 2000 described with reference to FIGS. 17 and 18.

According to the present disclosure, a semiconductor memory device capable of selectively outputting an internal ready busy signal and an external ready busy signal is provided.

Further, according to the present disclosure, an operating method of a semiconductor memory device capable of selectively outputting an internal ready busy signal and an external ready busy signal is provided.

Various embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of memory cells;
   a peripheral circuit configured to perform one of a read operation, a write operation, and an erase operation on the memory cell array;
   a ready busy signal generator configured to selectively output one of an internal ready busy signal and an external ready busy signal according to an operation of the semiconductor memory device; and
   control logic configured to control operations of the peripheral circuit and the ready busy signal generator.

2. The semiconductor memory device of claim 1, wherein the ready busy signal generator includes:
   a signal selector configured to receive the external ready busy signal and the internal ready busy signal, and receive a status read control signal from the control logic,
   wherein the signal selector selects and outputs one of the external ready busy signal and the internal ready busy signal, based on the status read control signal.

3. The semiconductor memory device of claim 2, wherein the signal selector:
   selects and outputs the internal ready busy signal when the status read control signal is enabled; and
   selects and outputs the external ready busy signal when the status read control signal is disabled.

4. The semiconductor memory device of claim 3,
   wherein the semiconductor memory device receives a status read signal from a controller, and
   wherein the control logic:
   outputs the enabled status read control signal to the ready busy signal generator when the status read signal includes a first command; and
   outputs the disabled status read control signal to the ready busy signal generator when the status read signal does not include the first command.

5. The semiconductor memory device of claim 2, wherein the signal selector is configured as a multiplexer.

6. The semiconductor memory device of claim 2, wherein the ready busy signal generator further includes an external ready busy signal generator configured to generate an external ready busy signal and transfer the external ready busy signal to the signal selector.

7. The semiconductor memory device of claim 2, wherein the ready busy signal generator further includes an internal ready busy signal generator configured to generate an internal ready busy signal and transfer the internal ready busy signal to the signal selector.

8. The semiconductor memory device of claim 1, wherein the ready busy signal is output through a ready busy line provided separately from a data input/output line.

9. A method for operating a semiconductor memory device, the method comprising:
receiving a status read signal from a controller;
determining whether the status read signal includes a first command; and
outputting a ready busy signal, based on the result of the determining operation.

10. The method of claim 9, wherein, when the result of the determining operation is that the status read signal includes the first command, an internal ready busy signal is output in the outputting operation.

11. The method of claim 9, wherein, when the result of the determining operation is that the status read signal does not include the first command, an external ready busy signal output in the outputting operation.

12. A semiconductor memory device comprising:
a memory cell array including a plurality of memory cells;
a peripheral circuit configured to perform one of a read operation, a write operation, and an erase operation on the memory cell array; and
a ready busy signal generator configured to output a ready busy signal,
wherein the ready busy signal generator is configured to selectively output one of an internal ready busy signal and an external ready busy signal according to an operation of the semiconductor memory device.

13. The semiconductor memory device of claim 12, wherein the internal ready busy signal indicates a busy status when the peripheral circuit is performing one of the read operation, the write operation, and the erase operation on the memory cell array.

14. The semiconductor memory device of claim 12, wherein the external ready busy signal indicates whether the semiconductor memory device is ready to receive a command from a controller.

15. The semiconductor memory device of claim 12, wherein the ready busy signal generator includes a signal selector configured to receive the external ready busy signal and the internal ready busy signal, and select and output one of the external ready busy signal and the internal ready busy signal, based on a status read control signal.

16. The semiconductor memory device of claim 15, wherein the signal selector is configured as a multiplexer.

17. A method of operating a memory device, the method comprising:
enabling a status read control signal in response to a request of an internal ready busy signal;
providing the internal ready busy signal when the status read control signal is enabled; and
providing an external ready busy signal when the status read control signal is disabled,
wherein the internal ready busy signal represents whether the memory device is performing an operation,
wherein the external ready busy signal represents whether the memory device is ready to receive a command, and
wherein the memory device performs an operation in response to the command.

* * * * *